United States Patent [19]

Mäder

[11] Patent Number: 5,432,827
[45] Date of Patent: Jul. 11, 1995

[54] CLOCK EXTRACTION CIRCUIT FOR FIBER OPTIC RECEIVERS

[75] Inventor: Heinz B. Mäder, Weinfelden, Switzerland

[73] Assignee: Telefonaktiebolaget L M Ericsson, Stockholm, Sweden

[21] Appl. No.: 162,909

[22] Filed: Dec. 8, 1993

Related U.S. Application Data

[63] Continuation of Ser. No. 892,210, Jun. 2, 1992, abandoned.

[51] Int. Cl.6 .......................... H03D 3/24; H04L 7/02; H03L 7/00
[52] U.S. Cl. ........................ 375/576; 331/2; 375/359
[58] Field of Search ............... 375/80, 81, 82, 110, 375/120; 331/2, 7, 17, 25, 32, 34, 46; 329/307

[56] References Cited

U.S. PATENT DOCUMENTS

| | | |
|---|---|---|
| 4,527,277 | 7/1985 | Kosaka et al. ............. 375/82 |
| 4,590,602 | 5/1986 | Wolaver . |
| 4,661,965 | 4/1987 | Maru . |
| 4,750,193 | 6/1988 | Bailey . |
| 4,773,085 | 9/1988 | Cordell . |
| 4,780,893 | 10/1988 | Henkelman, Jr. . |
| 4,787,097 | 11/1988 | Rizzo . |
| 4,805,197 | 2/1989 | Van Der Jagt et al. ......... 375/110 |
| 4,862,484 | 8/1989 | Roberts . |
| 4,914,401 | 4/1990 | Mäder . |
| 4,943,788 | 7/1990 | Laws et al. . |
| 4,970,474 | 11/1990 | Kennedy et al. ............... 331/2 |
| 4,972,161 | 11/1990 | Davies et al. . |
| 5,022,058 | 6/1991 | Yoshida et al. . |

OTHER PUBLICATIONS

D. J. Millicker et al, Bell Communications Research Inc., "Delay-and-multiply timing recovery circuit for lightwave transmission systems using NRZ format", OFC 1985 chapter TUG3.

Primary Examiner—Stephen Chin
Assistant Examiner—Duane Kobayashi
Attorney, Agent, or Firm—Burns, Doane, Swecker & Mathis

[57] ABSTRACT

A circuit for regenerating a clock signal from an NRZ encoded signal. The NRZ signal is filtered, differentiated, and applied to a nested phase-locked loop. The main loop of the phase-locked loop includes a voltage controlled crystal oscillator. The inner loop of the nested phase-locked loop includes a voltage controlled oscillator which multiplies the frequency of the signal provided by the crystal oscillator to obtain the regenerated clock signal. Tunable low pass filters are used in the differentiating circuit as delay elements. The voltage controlled oscillator includes a tunable low pass filter and an integrator. The control voltage for the inner loop voltage controlled oscillator is used to control the low pass filters of the differentiating circuit in a frequency locked loop.

25 Claims, 6 Drawing Sheets

CLOCK EXTRACTION CIRCUIT FOR FIBER OPTIC RECEIVERS

This application is a continuation of application Ser. No. 07/892,210, filed Jun. 2, 1992 now abandoned.

CROSS-REFERENCE TO RELATED APPLICATION

This application is related to application Ser. No. 194,947 filed May 17, 1988, now issued to Heinz B. Mäder as U.S. Pat. No. 4,914,401 for Implementation and Control of Filters. The disclosure of U.S. Pat. No. 4,914,401 is hereby incorporated by reference.

BACKGROUND OF THE INVENTION

The present invention relates to a clock extraction circuit. More particularly, the present invention relates to a clock extraction circuit, suitable for monolithic integration fabrication, for use in a fiber optical receiver, and which utilizes a nested phase-locked loop for clock regeneration and a frequency-locked loop for a differentiation network.

One known technique of transmitting digital information is with a nonreturn-to-zero coded (NRZ coded) data stream in which a binary "1" is represented by one bit time at the 1, or high, level and a binary "0" is represented by one bit time at the 0, or low, level. This NRZ coding scheme permits placing about twice as much data on the data stream as can be provided with a return-to-zero code, in which a binary 0 is represented by one bit time at the 0 level, and a binary 1 is pulsed in such a way that it reaches the 1 level for only half a bit time. A return-to-zero coded signal therefore returns to 0 (or remains at 0) after each bit of data.

Communications over fiber optic channels often require a receiver to extract a clock signal from an NRZ coded data stream for retiming purposes. Of course, for accurate data transmission it is important to maximize the reliability and precision of the clock extraction circuit.

Ideally, a practical clock extraction circuit should be suitable for monolithic integration with bipolar technology. To minimize production costs, the design of the clock extraction circuit should guarantee high level performance without production adjustments. Additionally, the clock extraction circuit should be independent of absolute device tolerances.

It is a primary object of the present invention to provide a reliable and accurate clock extraction circuit for use in a receiver of NRZ encoded data. It is a further object of the present invention to provide a clock extraction circuit suitable for integration in a bipolar device and which is insensitive to absolute device tolerances.

BRIEF SUMMARY OF THE INVENTION

In accordance with the preferred embodiment of the present invention, a clock extraction circuit for use in a fiber optical receiver circuit is provided with a voltage controlled crystal oscillator in a nested phase-locked loop arrangement for regenerating a clock signal from a received data signal. The auxiliary, inner loop of the nested phase-locked loop multiplies the frequency of the voltage controlled crystal oscillator to obtain higher frequency clock signals needed in fiber optic communication applications.

In accordance with another aspect of the present invention, the preferred embodiment utilizes signal differentiation with a low pass filter in a frequency-locked loop arrangement to regenerate a clock signal. Additionally, a voltage controlled oscillator based on a tunable low pass filter and an integrator suitable to control low pass filters in a frequency-locked loop arrangement is proposed.

BRIEF DESCRIPTION OF THE DRAWINGS

The objects, features and advantages of the present invention will become apparent from a reading of the following detailed description when viewed in light of the accompanying drawings, in which:

FIG. 5 is a graph of transient simulation analysis results of filter and delay elements arranged in accordance with FIGS. 1, 3 and 4;

DETAILED DESCRIPTION OF THE PREFERRED EMBODIMENT

The present invention is described in conjunction with a particular preferred embodiment for extracting a clock signal from an NRZ encoded signal in a fiber optic communications network. It will be appreciated by those skilled in the art that the features and advantages of the present invention may be utilized in other arrangements as well without departing from the spirit of the invention.

Figure 1:
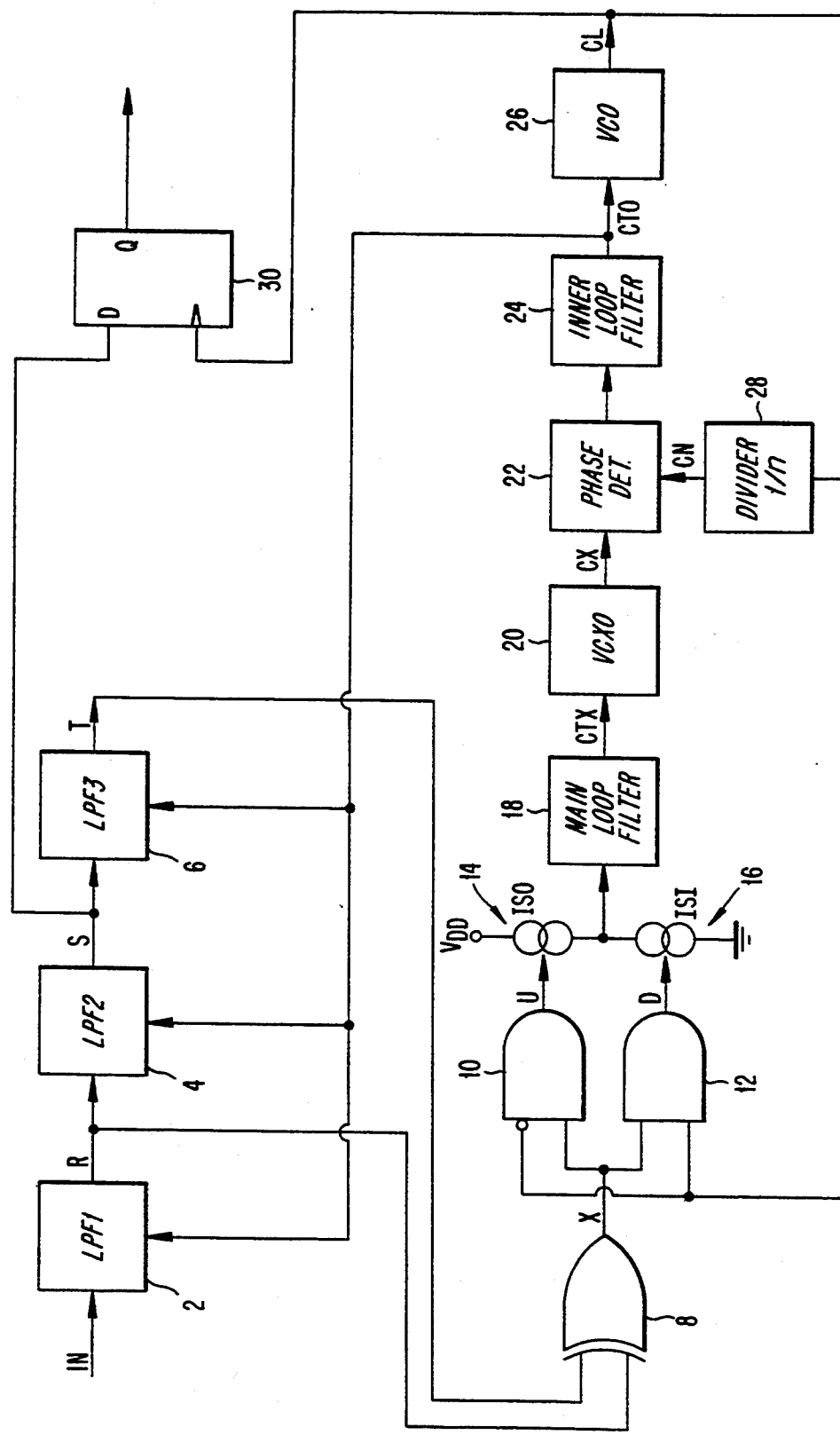
FIG. 1 is a block diagram of a preferred clock extraction network constructed in accordance with the present invention.

Referring to FIG. 1, the preferred embodiment of the present invention includes a receiver having a network of second order low pass filters LPF1, LPF2 and LPF3 connected in series. The first filter LPF1 receives an NRZ coded data signal on input line IN and filters the data signal in a known manner to limit the bandwidth of the received signal for noise considerations.

The second and third low pass filters, LPF2 and LPF3, respectively, are introduced to provide delay to the filtered data signal R. As can be seen generally in FIG. 2, the output signal S of low pass filter LPF2 is delayed from the filtered data signal R by ¼ bit time. The low pass filter LPF3 provides a further ¼ bit time delay in producing output signal T. Thus, the signal T is delayed ½ bit time from the filtered data signal R.

Figure 2:
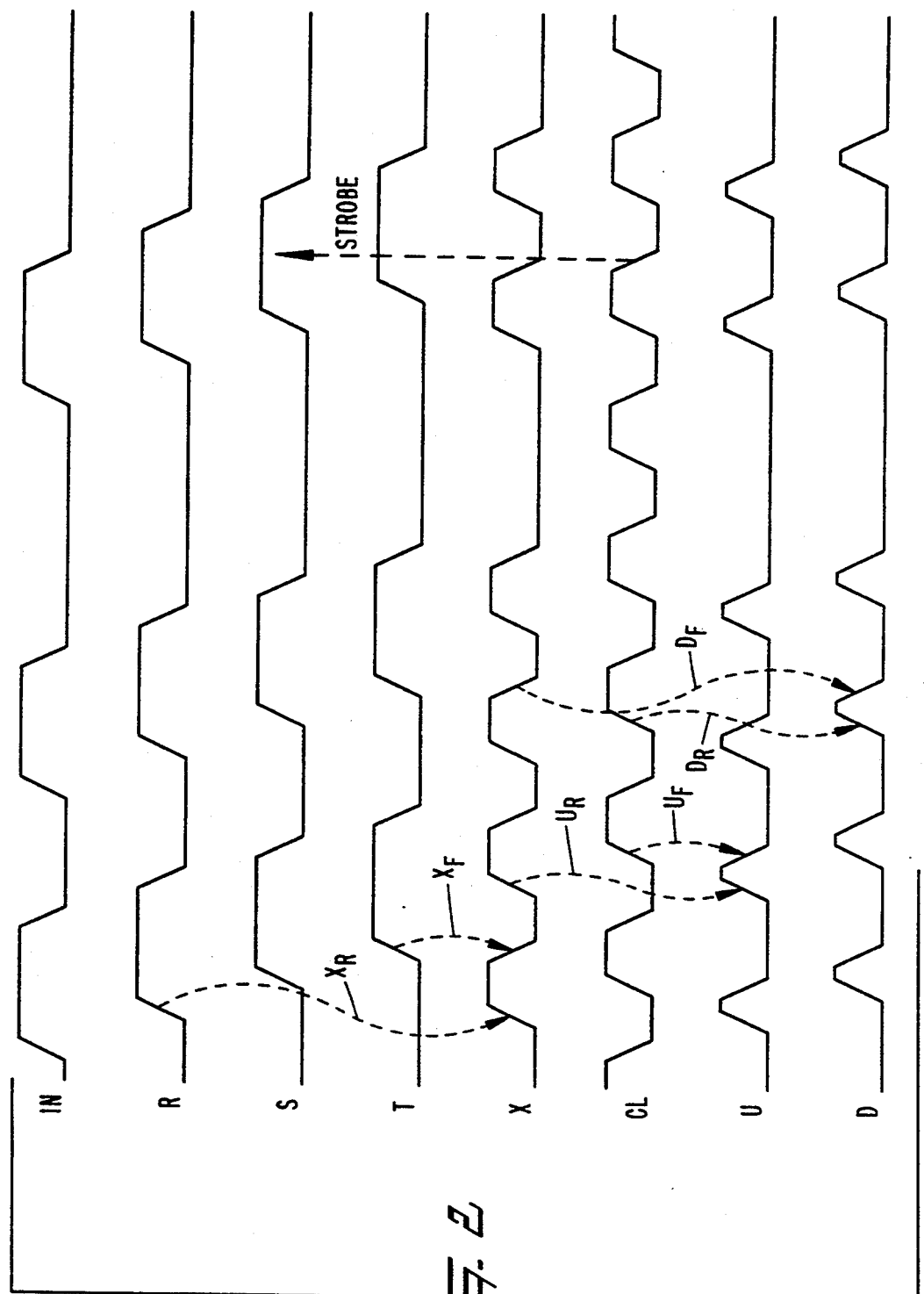
FIG. 2 is a timing diagram useful in explaining the operation of the clock extraction network of FIG. 1.

The delays provided by low pass filters LPF2 and LPF3 are introduced to delay the filtered data signal R for differentiation purposes. The output R of low pass filter LPF1 and the output T of low pass filter LPF3 are input to an EXCLUSIVE OR (XOR), or nonequality, gate 8, which provides a differential output signal X. Briefly, XOR gate 8 provides a high output (differential output signal X) when one, and only one, of its input lines (the R and T signals) is high. As shown in FIG. 2, the output signal X has a pulse of ½ bit time nominal duration for each data transition in filtered data signal R.

The differential signal X produced by XOR gate 8 is connected with input terminals of two-input AND gates 10 and 12. The second input of AND gate 10 is inverted clock signal $\overline{CL}$, and the second input of AND gate 12 is the noninverted clock signal CL. The AND gates 10 and 12 operate in a conventional manner to produce output signals U and D, respectively.

A nested phase locked loop (PLL) is used to regenerate the clock signal. The main loop of the nested PLL includes a charge pump having a pulsed current source ISO 14 and a current sink ISI 16. At nominal, the two currents are equal, i.e. $|ISO| = |ISI|$. In operation, the charge pump is driven by the outputs U and D of AND gates 10 and 12, respectively. When the differential signal X is high, the output U of AND gate 10 goes high when the clock signal CL is low, thereby driving current source ISO 14. Current sink ISI 16 allows a sinking current to flow when the inputs to AND gate 12, differential signal X and clock signal CL, are both high, thereby causing output signal D to go high.

With equal nominal currents of the charge pump elements, this phase detector will regulate the phase of the extracted clock such that equal sourcing and sinking charge packets will be generated. This is the case with the leading edge of the clock signal CL being in the center of the differentiated pulses of signal X.

The output of the charge pump is fed to a conventional main loop filter 18 which provides an output control voltage signal CTX to a voltage controlled crystal oscillator VCXO 20. Since crystal oscillators are not available for the high clock frequencies used for optical data transmission, it is necessary to multiply the frequency of the output signal from VCXO 20. In accordance with one aspect of the present invention, a nested auxiliary phase-locked loop is provided for this purpose.

The nested inner loop includes a sequential phase detector 22, an inner loop filter 24, a voltage controlled oscillator (VCO) 26, and a frequency divider 28. The frequency divider is given a divider ratio n, where n is the ratio between the frequency of the clock signal and the frequency of the crystal oscillator.

The phase detector 22 is provided with a first input CX from VCXO 20 and a second input CN from frequency divider 28. The output of phase detector 22 is fed to the inner loop filter 24 which, in turn, provides a control signal CTO for VCO 26. The control signal CTO also operates to control the low pass filters LPF1, LPF2 and LPF3. The aperiodic nature of the sequential phase detector 22 prevents the inner loop from false locking to assure that the frequency of clock signal CL is equal to n times the frequency of the crystal oscillator VCXO 20.

A clocked D-latch 30 serves as a retiming latch for the received data. As seen in FIG. 1, the delayed data signal S from delay element 4 is provided to the data input of the retiming latch 30. The data latch is clocked by the regenerated clock CL from VCO 26. The retiming latch 30 is transparent with the clock CL being high and thus assumes the state of the signal S on its data input. At the clock high-to-low transition, the retiming latch 30 latches the state established just prior to the clock transition.

The latched state represents the captured data value and will be used for further processing. Thus, the time of the clock transition may be regarded as the "observation instant" or the strobe instant. The strobe position is the relative placement of the strobe instant with respect to data transitions. To minimize data errors, the optimum strobe position is established when the high-to-low transition of the clock CL is centered on data values. For this reason the delayed data signal S is used as the data input to the retiming latch.

Turning again to FIG. 2, in operation the clock extraction circuit of FIG. 1 receives a pulsed NRZ coded input data signal IN and applies it to low pass filter LPF1. The illustrated data signal IN carries an eight bit digital data series 00100101. Low pass filter LPF1 filters the input data signal IN to produce filtered data signal R.

The filtered data signal R is then provided to a delay network including filters LPF2 and LPF3. The filtered data signal R is delayed by ¼ bit time by each of low pass filters LPF2 and LPF3 to produce delayed signals S and T, respectively. Thus, delayed data signals S and T lag filtered data signal R by ¼ bit time and ½ bit time, respectively.

The filtered data signal R from low pass filter LPF1 and the delayed signal T from low pass filter LPF3 are fed to XOR gate 8. As indicated in FIG. 2 by the dashed line $X_R$, the differential output signal X of XOR gate 8 goes high with the leading edge of the pulse on filtered data signal R. The rising edge of delayed data signal T causes the differential signal X to go low, as indicated by the dashed line $X_F$. The falling edge of the pulse on filtered data signal R causes the differential output signal X of XOR 8 to again go high, and the falling edge of the delayed data signal T causes the differential output signal X to go low. Thus, each data transition supplied to the receiver on the data signal causes one pulse on the differential signal X.

The output signal U of AND gate 10 is driven by the differential X signal and the clock signal CL. As indicated in FIG. 2 by dashed line $U_R$, a low clock signal applied to the inverting input of AND gate 10 and a high X signal applied to the other input cause output signal U to go high. The rising edge of the clock signal CL causes the output signal U to go low, as indicated by dashed line $U_F$. Similarly, the differential signal X and the non-inverted clock signal CL are inputs to AND gate 12 and control the output signal D, as indicated by dashed lines $D_R$ and $D_F$. The output signal U operates the current source ISO 14 of the charge pump, and output signal D operates the current sink ISI 16 of the charge pump.

Pulses of the delayed data signal S on the tapping between low pass filter LPF2 and low pass filter LPF3 are positioned in the center of differentiated pulses of signal X, and therefore coincide with the leading edge of the clock signal CL. With the nominal clock signal CL having a duty cycle of 50%, the data strobe is centered between two data transitions of the signal S. In other words, the data strobe will occur in the middle of a pulse on the S signal. For this reason, the data input to retiming latch 30 is connected to the S signal output of low pass filter LPF2.

The position accuracy of the data strobe should be carefully maintained near its optimum. This requires the current source ISO and current sink ISI of the charge pump to be well-matched. Additionally, the clock signal duty cycle should be controlled to be 50%, and the propagation delays of low pass filter LPF1 and LPF2 should be well-matched. The use of a differential charge pump implementation to obtain well-matched current source and current sink is a conventional solution. Filter and oscillator arrangements suitable for use in the present invention are described below.

Figure 3:
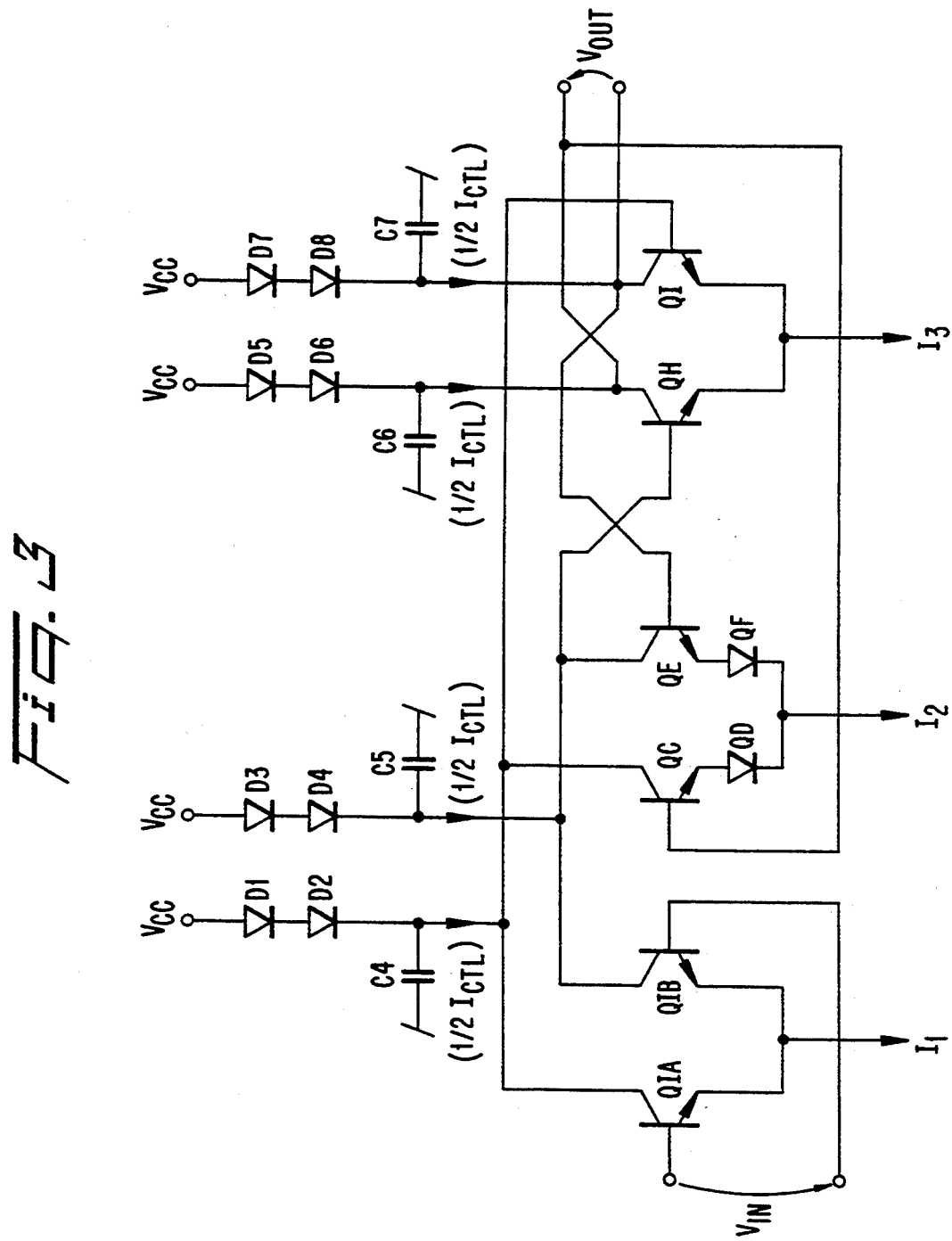
FIG. 3 is a schematic circuit diagram of a preferred construction for the low pass filters of FIG. 1.

Additional details of the low pass filters LPF1, LPF2 and LPF3 and the delay network are discussed with reference to FIGS. 3-5. Referring to FIG. 3, each of the low pass filters LPF1, LPF2 and LPF3 has the same basic circuit arrangement. The cut-off frequencies of the low pass filters and their related group delay may be set by adjusting the values of the capacitors in the filter circuit. The filter circuit of FIG. 3 is substantially equivalent to that shown in FIG. 6 of the above-referenced U.S. Pat. No. 4,914,401, which is incorporated herein by reference. Additional details of the preferred filter circuit are given in that patent.

Figure 6:
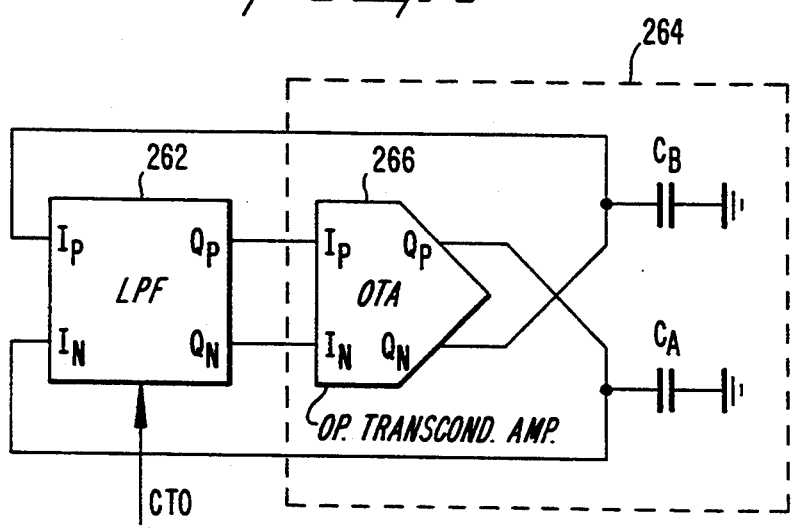
FIG. 6 is a block diagram of a preferred voltage-controlled oscillator in accordance with one aspect of the present invention.
Figure 6:
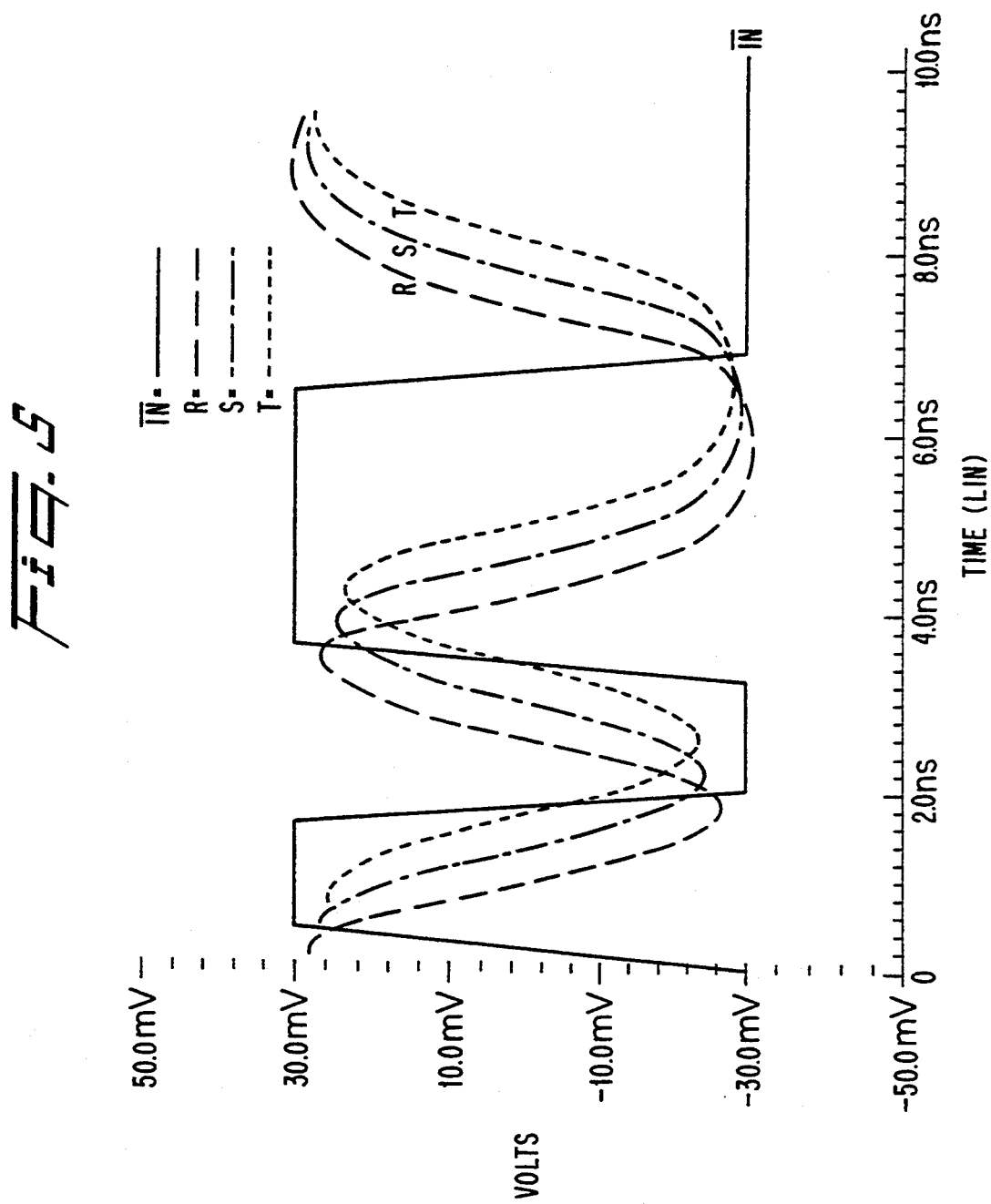

The low pass filter illustrated in FIG. 6 of U.S. Pat. No. 4,914,401 includes a single capacitor $C_1$ connected across the cathodes of diode elements $D_2$ (node 1) and $D_4$ (node 2). A single capacitor $C_2$ is connected across the cathodes of diode elements $D_6$ (node 3) and $D_8$ (node 4). The capacitor $C_1$ signifies the essential capacitance between node 1 and node 2; and the capacitor $C_2$ signifies the essential capacitance between node 3 and node 4. Since no terminal of the capacitors $C_1$ and $C_2$ is grounded, the capacitors may be considered to be floating.

In the preferred embodiment of the present invention, these floating capacitors have been replaced by four grounded capacitors, $C_4$, $C_5$, $C_6$ and $C_7$ (FIG. 3) due to relatively small capacitance values. Since a differential signal is established between node 1 and node 2 (and between node 3 and node 4), the AC voltage of node 1 and of node 2 are of the same amplitude but in antiphase. Considering differential signals the floating capacitor $C_1$ may be replaced by the grounded capacitors $C_4$ and $C_5$ of FIG. 3. For proper results $C_4$ should be equal to $C_5$ and double the capacitance of $C_1$, i.e. $C_4 = C_5 = 2 \times C_1$.

Integrated circuit capacitors have associated stray capacitance to ground. This stray capacitance originates primarily from the bottom plate (Csb) but also to some degree from the top plate (Cst). A floating capacitor between node 1 and node 2 is preferably implemented with integrated capacitors by connecting two identical capacitors Cx and Cy in parallel where the top plate of Cx connects to node 1 and the bottom plate of Cx connects to node 2. The top plate of Cy is connected with node 2 and the bottom plate of Cy is connected with node 1. Because of network symmetry, node 1 and node 2 have the same stray capacitance to ground. The resulting capacitance measured differentially between node 1 and node 2 becomes $C = Cx + Cy + \frac{1}{2}(Csb + Cst)$.

Figure 4:
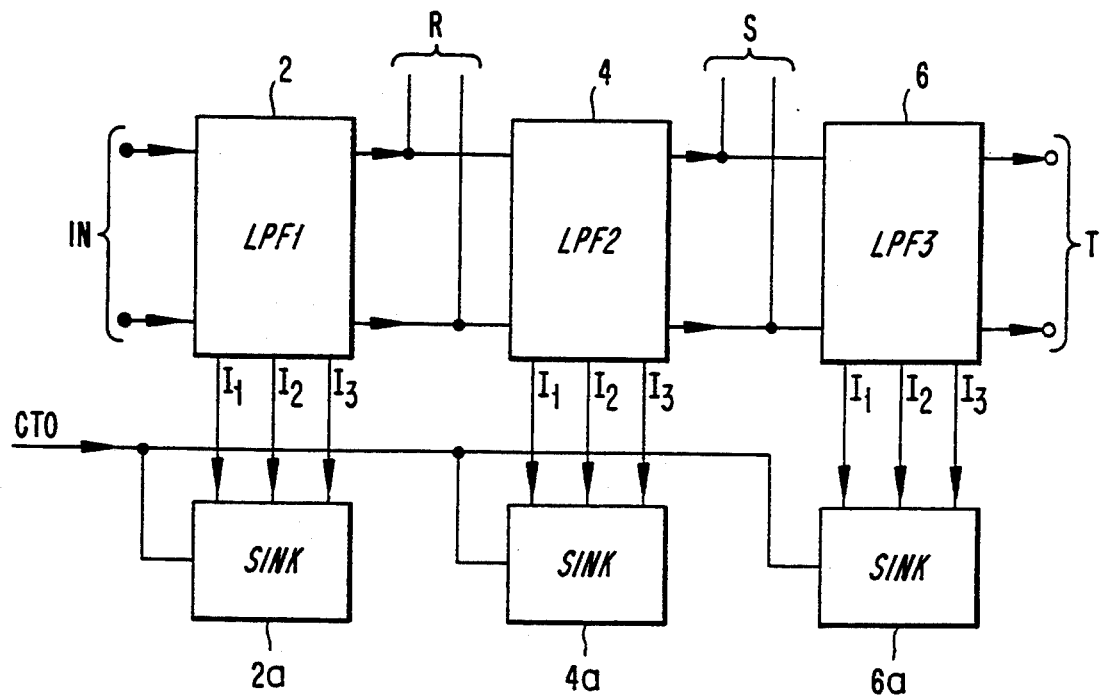
FIG. 4 is a block diagram showing additional detail of the low pass filter network of FIGS. 1 and 3.

FIG. 4 illustrates the preferred manner in which the filter and delay network may be implemented. The filter circuit of FIG. 3 is shown having sink currents $I_1$, $I_2$ and $I_3$. Accordingly, a current sink circuit $2a$ is associated with low pass filter LPF1; current sink circuit $4a$ is associated with low pass filter LPF2; and current sink circuit $6a$ is associated with low pass filter LPF3. The output signal CTO of inner loop filter 24 (FIG. 1) acts as a control input to the sink circuits $2a$, $4a$ and $6a$. Thus, all three low pass filters LPF1, LPF2 and LPF3 have a control terminal coupled with the control terminal of VCO 26. Additional details on the structure of the current sink circuits are given in the aforementioned U.S. Pat. No. 4,914,401, and are not repeated here.

The essential matching of the group delay of low pass filters LPF2 and LPF3 may be assured by the small relative matching errors of the elements available with monolithic integrated circuit fabrication. To avoid distortion in the subsequent logic gates, it is important that the slew rates of the low pass filter outputs R, S and T are substantially identical. For this reason, low pass filter LPF2 should be fed by low pass filter LPF1, thereby limiting the slew rate of filtered data signal R. The order of low pass filters LPF2 and LPF3 is determined by bandwidth considerations. To maintain the slew rate of filtered data signal R at delayed data signals S and T, low pass filters LPF2 and LPF3 must have a higher cut-off frequency than low pass filter LPF1 such that a small degree of signal attenuation occurs through low pass filters LPF2 and LPF3 in the pass band of low pass filter LPF1. Due to this requirement, low pass filters LPF2 and LPF3 need to be at least of the second order.

As noted above, all three low pass filters LPF2, LPF2 and LPF3 have a control terminal coupled with the control terminal of the VCO 26. Since VCO 26 is phase-locked to the received data stream, the low pass filters LPF1, LPF2 and LPF3 are frequency-locked to the extracted clock frequency. In other words, low pass filters LPF1, LPF2 and LPF3 are controlled by a frequency-locked loop arrangement.

Because of the frequency-locked loop arrangement, the filter characteristics become substantially insensitive to the absolute tolerances of the integrated device. Rather, relative tolerances between elements, which tend to be small with monolithic integration, determines performance. For this reason, the duration of the pulses in the differential signal X can more easily be maintained at nominal, independent of fabrication processing variations. The linear range of the phase detector depends on the duration of the differential signal X, and approaches a maximum of $\pm \frac{1}{4}$ bit time when the differential signal X has a nominal duration of $\frac{1}{2}$ bit time.

FIG. 5 is a graph of transient simulation analysis results of the filter and delay elements of FIGS. 1, 3 and 4, and illustrates the relationship between the input data signal IN and the signals R, S and T produced by low pass filters LPF1, LPF2 and LPF3 for a typical filter network. For convenience, the inverted input data signal $\overline{IN}$ is drawn to permit visibility of the traces for the signals R, S and T. Each signal S and T is subject to a $\frac{1}{4}$ bit time delay, and is slightly attenuated. Attenuation of the signals may be reduced as discussed above. Other known design techniques for reducing the effect of attenuation may also be applied.

In accordance with another aspect of the present invention, the voltage controlled oscillator 26 of the inner nested phase-locked loop is preferably formed of a tunable second order low pass filter and an integrator. Referring now to FIG. 6, the VCO 26 includes a low pass filter 262 and an integrator 264. The integrator 264 comprises an operational transconductance amplifier (OTA) 266 and a pair of capacitors $C_A$ and $C_B$. The low pass filter 262 has a positive input terminal $I_p$, a negative input terminal $I_N$, a positive output terminal $Q_p$ and a negative output terminal $Q_N$. Similarly, OTA 266 includes positive and negative input terminals $I_p$ and $I_n$, and positive and negative output terminals $Q_p$ and $Q_n$.

The positive output terminal $Q_p$ of low pass filter 262 is coupled with the positive input terminal $I_p$ of OTA 266, and negative output terminal $Q_N$ of the low pass filter 262 is connected with the negative input terminal $I_n$ of OTA 266. Capacitor $C_A$ is connected between the positive output terminal $Q_p$ of OTA 266 and ground.

Capacitor $C_B$ is connected between the negative output terminal $Q_n$ of OTA 266 and ground. The positive output $Q_p$ of OTA 266 is also fed back to the negative input $I_N$ of the low pass filter 262, and the negative output $Q_n$ of OTA 266 is fed back to the positive input $I_p$ of the low pass filter 262.

Figure 7:
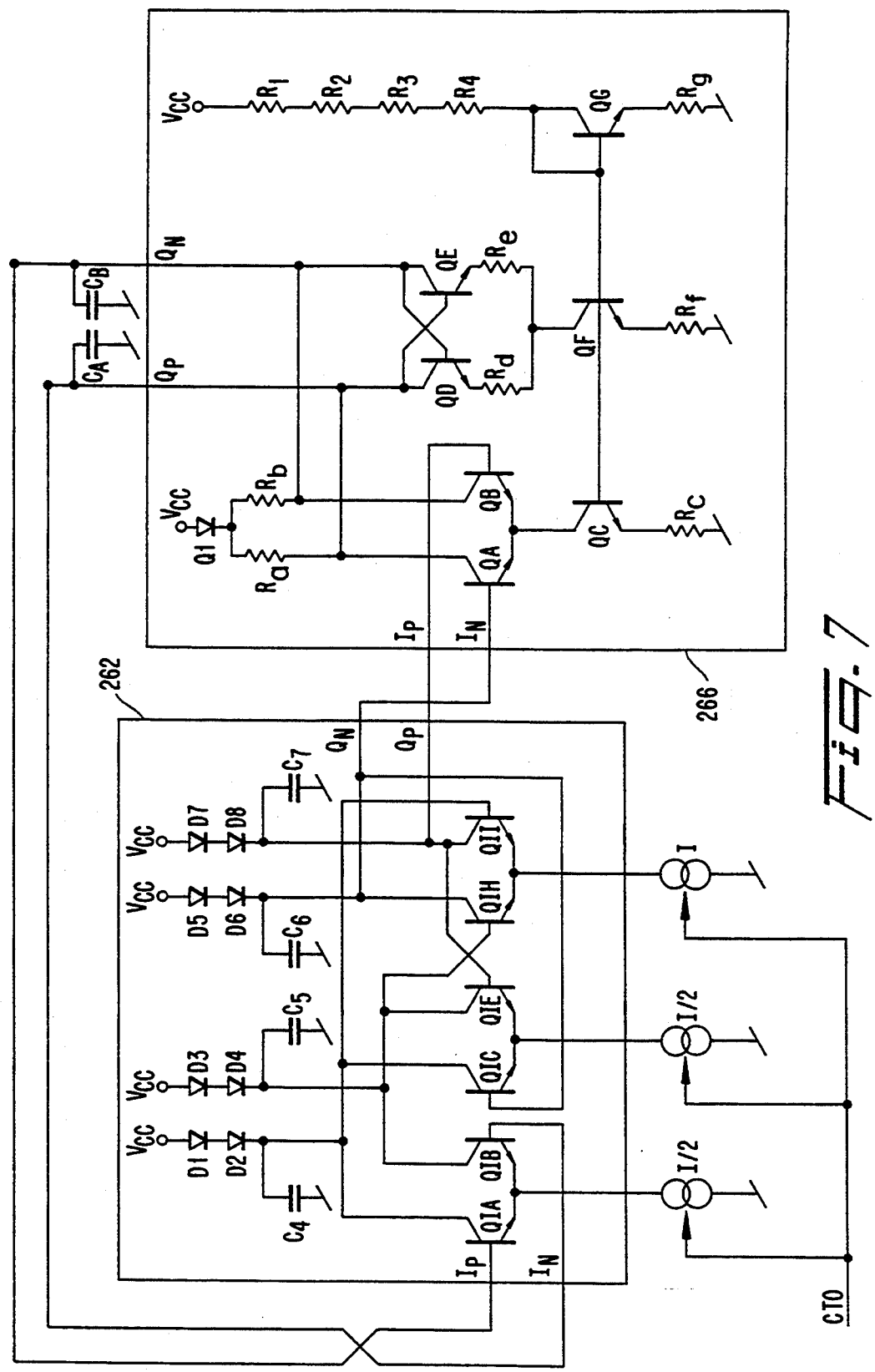
FIG. 7 is a schematic circuit diagram of the voltage-controlled oscillator of FIG. 6.

A schematic circuit diagram of the circuit illustrated in FIG. 6 is given in FIG. 7. The low pass filter 262 is of the same construction as the low pass filters LPF1, LPF2 and LPF3 discussed above, except that the capacitance values of the internal capacitors are altered to change the respective filter cut-off frequencies.

The OTA 266 includes transistors $Q_A$ and $Q_B$ and resistors $R_a$ and $R_b$ which together form an emitter coupled pair amplifier stage. Transistors $Q_D$ and $Q_E$, together with resistors $R_d$ and $R_c$ form a negative impedance network. Transistors $Q_c$, $Q_F$ and $Q_G$ and resistors $R_c$, $R_f$ and $R_g$ form a current mirror to provide a dc bias to the emitter coupled pair amplifier stage and to the negative impedance network. The bias current is set by the series-connected resistors $R_1$, $R_2$, $R_3$ and $R_4$. Diode $Q_1$ is provided for dc considerations to reduce the power supply voltage $V_{cc}$.

The negative impedance network of OTA 266 is connected in parallel with pull-up resistors $R_a$ and $R_b$. Assuming ideal transistors $Q_D$ and $Q_F$, the negative impedance becomes $-(R_c+R_d)$. If $R_a$, $R_b=R_c$, $R_d$ then the resulting load impedance becomes infinite. With real devices ($Q_c$, $Q_d$) the load impedance is increased by the negative impedance network approximately fifty times. The principles of such negative impedance networks is well-known.

The frequency of the voltage controlled oscillator 26 is set by the cut-off frequency of the low pass filter 262, and hence can be controlled by input signal CTO. Referring back to FIG. 1, the control signal CTO is provided by inner loop filter 24. The control signal CTO is applied to the sink current circuits of low pass filter 262 in the same manner as it is applied to the sink current circuits of low pass filters LPF1, LPF2 and LPF3, as illustrated in FIG. 4.

The low pass filter 262 imposes a 90° phase shift at the cut-off frequency. Since the integrator 264 also imposes a 90° phase shift over the frequency range of interest, the phase requirement of this oscillator is established at the cut-off frequency of the low pass filter 262. The preferred structure of the VCO 26 is particularly well-suited to controlling low pass filters in a frequency-locked loop since the frequency of the oscillator is also determined by a low pass filter.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

I claim:

1. A circuit for providing a clock signal from an input data stream Signal having a clocked data Stream of successive bits, comprising:
   means for differentiating said input data stream signal to provide an input data differential signal; and
   a nested phase-locked loop for regenerating said clock signal, said nested phase-locked loop having a main phase-locked loop and an inner phase-locked loop, said main phase-locked loop including;
   a main loop phase detector responsive to said input data differential signal and said clock signal to provide a main loop phase regulation signal;
   a main loop filter which operates on said main loop phase regulation signal to provide a main loop oscillator control voltage; and
   a voltage controlled crystal oscillator responsive to said main loop oscillator control voltage to produce a main loop oscillating signal: said inner phase-locked loop including:
   an inner loop phase detector responsive to said main loop oscillating signal and a frequency-divided clock signal to produce an inner loop phase regulation signal;
   an inner loop filter which operates on said inner loop phase regulation signal to provide an inner loop oscillator control voltage;
   a voltage controlled oscillator having an oscillating frequency that is a factor n times the frequency of said voltage controlled crystal oscillator and responsive to said inner loop oscillator control voltage to produce said clock signal; and
   means for dividing said clock signal by the factor n to produce said frequency-divided clock signal,
   wherein said differentiating means includes means for delaying said input data stream signal by ½ bit time, said delaying means including a plurality of low-pass filters connected in series, each low pass filter of said delaying means having a control input connected with said inner loop oscillator control voltage.

2. The circuit of claim 1, wherein said delaying means includes two low-pass filters, each low-pass filter of said delaying means operable to delay said input data stream signal by ¼ bit time.

3. The circuit of claim 1, wherein said voltage controlled oscillator includes a low pass filter and an integrator, said low pass filter of said voltage controlled oscillator including a cut-off frequency control input for receiving said inner loop oscillator control voltage, said inner loop oscillator control voltage controlling the oscillating frequency of said voltage controlled oscillator.

4. The circuit of claim 3, wherein said integrator includes an operational transconductance amplifier and a plurality of capacitors.

5. The circuit of claim 1, wherein said voltage controlled oscillator includes:
   a low pass filter having a cut-off frequency control input for receiving said inner loop oscillator control voltage, a positive input terminal, a negative input terminal, a positive output terminal, and a negative output terminal;
   an operational transconductance amplifier having a positive input terminal connected with the positive output terminal of said low pass filter, a negative input terminal connected with the negative output terminal of said low pass filter, a positive output terminal connected with the negative input terminal of said low pass filter, and a negative output terminal connected with the positive input terminal of said low pass filter;
   a first capacitor connected between the positive output terminal of said operational transconductance amplifier and a reference voltage; and a second capacitor connected between the negative output terminal of said operational transconductance amplifier and said reference voltage.

6. A circuit for providing a clock signal from an input data stream Signal having a clocked data Stream, Comprising:

means for differentiating said input data stream signal to provide an input data differential signal; and a nested phase-looked loop for regenerating said clock signal, said nested phase-locked loop having a main phase-locked loop and an inner phase-locked loop, said main phase-locked loop including;

a main loop phase detector responsive to said input data differential signal and said clock signal to provide a main loop phase regulation signal;

a main loop filter which Operates on said main loop phase regulation signal to provide a main loop oscillator control voltage; and a voltage controlled crystal oscillator responsive to said main loop oscillator control voltage to produce a main loop oscillating signal; said inner phase-locked loop including;

an inner loop phase detector responsive to said main loop oscillating signal and a frequency-divided Clock Signal to produce an inner loop phase regulation signal;

an inner loop filter which operates on Said inner loop phase regulation signal to provide an inner loop oscillator control voltage;

a voltage controlled oscillator having an oscillating frequency that is a factor n times the frequency of said voltage controlled crystal oscillator and responsive to said inner loop oscillator control voltage to produce said clock signal; and means for dividing said clock signal by the factor n to produce said frequency-divided clock signal, wherein said voltage controlled oscillator includes a low pass filter and an integrator, said low pass filter including a cut-off frequency control input for receiving said inner loop oscillator control voltage, said inner loop oscillator control voltage controlling the oscillating frequency of said voltage controlled oscillator.

7. The circuit of claim 6, wherein said integrator includes an operational transconductance amplifier and a plurality of capacitors.

8. A circuit for providing a clock signal from an input data stream signal having a clocked data stream, comprising: means for differentiating said input data stream signal to provide an input data differential signal; and a nested phase-locked loop for regenerating said clock signal, said nested phase-locked loop having a main phase-locked loop and an inner phase-locked loop, said main phase-locked loop including:

a main loop phase detector responsive to said input data differential signal and said clock signal to provide a main loop phase regulation signal:

a main loop filter which operates on said main loop phase regulation signal to provide a main loop oscillator control voltage; and a voltage controlled crystal oscillator responsive to said main loop oscillator control voltage to produce a main loop oscillating signal; said inner phase-locked loop including:

an inner loop phase detector responsive to said main loop oscillating signal and a frequency-divided clock signal to produce an inner loop phase regulation signal;

an inner loop filter which operates on said inner loop phase regulation signal to provide an inner loop oscillator control voltage;

a voltage controlled oscillator having an oscillating frequency that is a factor n times the frequency of said voltage controlled crystal oscillator and responsive to said inner loop oscillator control voltage to produce said clock signal; and means for dividing said clock signal by the factor n to produce said frequency-divided clock signal, wherein said voltage controlled oscillator includes: a low pass filter having a cut-off frequency control input for receiving said inner loop oscillator control voltage, a positive input terminal, a negative input terminal, a positive output terminal, and a negative output terminal;

an operational transconductance amplifier having a positive input terminal connected with the positive output terminal of said low pass filter, a negative input terminal connected with the negative output terminal of said low pass filter, a positive output terminal connected with the negative input terminal of said low pass filter, and a negative output terminal connected with the positive input terminal of said low pass filter;

a first capacitor connected between the positive output terminal of said operational transconductance amplifier and a reference voltage; and a second capacitor connected between the negative output terminal of said operational transconductance amplifier and said reference voltage.

9. A clock extraction circuit comprising:

means for differentiating an input data stream signal having a clocked data stream of successive bits to provide an input data differential signal:

a nested phase-locked 10op responsive to said input data differential signal for regenerating a clock signal, said nested phase-locked loop having a main phase-locked loop and an inner phase-locked loop, said main phase-locked loop including a voltage controlled crystal oscillator for producing a first oscillating Signal, said inner phase-locked loop including a voltage controlled oscillator responsive to an inner loop oscillator control voltage for multiplying the frequency of said first oscillating signal to produce said clock signal, wherein said differentiating means includes an EXCLUSIVE OR logic gate and means for delaying said input data stream signal by ½ bit time for producing a delayed input data stream signal, said EXCLUSIVE OR logic gate having a first input for receiving said input data stream signal and a second input for receiving said delayed input data stream signal, said input data differential signal being provided on the output of said EXCLUSIVE OR or logic gate, and wherein said delaying means includes a plurality of low-pass filters connected in series, each low pass filter of said delaying means having a control input connected with said inner loop oscillator control voltage.

10. The clock extraction circuit of claim 9, wherein said delaying means includes two low-passs filters, each low-pass filter of said delaying means operable to delay said input data stream signal by ¼ bit time.

11. The clock extraction circuit of claim 9, wherein said voltage controlled oscillator includes a low pass filter and an integrator, said low pass filter of said voltage controlled oscillator including a cut-off frequency control input for receiving said inner loop oscillator control voltage, said inner loop oscillator control voltage controlling the oscillating frequency of said voltage controlled oscillator.

12. The clock extraction circuit of claim 11, wherein said integrator includes an operational transconductance amplifier and a plurality of capacitors.

13. The clock extraction circuit of claim 9, wherein said voltage controlled oscillator includes:
- a low pass filter having a cut-off frequency control input for receiving said inner loop oscillator control voltage, a positive input terminal, a negative input terminal, a positive output terminal, and a negative output terminal;
- an operational transconductance amplifier having a positive input terminal connected with the positive output terminal of said low pass filter, a negative input terminal connected with the negative output terminal of said low pass filter, a positive output terminal connected with the negative input terminal of said low pass filter, and a negative output terminal connected with the positive input terminal of said low pass filter;
- a first capacitor connected between the positive output terminal of said operational transconductance amplifier and a reference voltage; and
- a second capacitor connected between the negative output terminal of said operational transconductance amplifier and said reference voltage.

14. A clock extraction circuit, comprising:
means for differentiating an input signal having a clocked data stream to provide an input data differential signal;
a nested phase-locked loop responsive to said input data differential signal for regenerating said clock signal, said nested phase-locked loop having a main phase-locked loop and an inner phase-locked loop, said main phase-locked loop including a voltage controlled crystal oscillator for producing a first oscillating signal, said inner phase-locked loop including a voltage controlled oscillator responsive to an inner loop oscillator control voltage for multiplying the frequency of said first oscillating signal to produce said clock signal,
wherein said voltage controlled oscillator includes a low pass filter and an integrator, said low pass filter including a cut-off frequency control input for receiving said inner loop oscillator control voltage, said inner loop control voltage controlling the oscillating frequency of said voltage controlled oscillator.

15. The clock extraction circuit of claim 14, wherein said integrator includes an operational transconductance amplifier and a plurality of capacitors.

16. A clock extraction circuit comprising:
means for differentiating an input signal having a clocked data stream to provide an input data differential signal;
a nested phase-locked loop responsive to said input data differential signal for regenerating said clock signal, said nested phase-locked loop having a main phase-locked loop and an inner phase-locked loop, said main phase-locked loop including a voltage controlled crystal oscillator for producing a first oscillating signal, said inner phase-locked loop including a voltage controlled oscillator responsive to an inner loop oscillator control voltage for multiplying the frequency of said first oscillating signal to produce said clock signal,
wherein said voltage controlled oscillator includes:
- a low pass filter having a cut-off frequency control input for receiving said inner loop oscillator control voltage, a positive input terminal, a negative input terminal, a positive output terminal, and a negative output terminal;
- an operational transconductance amplifier having a positive input terminal connected with the positive output terminal of said low pass filter, a negative input terminal connected with the negative output terminal of said low pass filter, a positive output terminal connected with the negative input terminal of said low pass filter, and a negative output terminal connected with the positive input terminal of said low pass filter;
- a first capacitor connected between the positive output terminal of said operational transconductance amplifier and a reference voltage; and
- a second capacitor connected between the negative output terminal of said operational transconductance amplifier and said reference voltage.

17. A circuit for providing a clock signal from an input data stream signal having a clocked data stream of successive bits, comprising:
means for differentiating said input data stream signal to provide an input data differential signal, said differentiating means including at least one low pass filter having a control input; and
means, responsive to said input data differential signal, for regenerating said clock signal, said clock regenerating means including a voltage controlled oscillator responsive to an oscillator control voltage, said oscillator control voltage being further provided to said control input of said low pass filter.

18. The circuit of claim 17, wherein said differentiating means includes a plurality of low pass filters connected in series, each of said low pass filters having a control input connected with said oscillator control voltage.

19. The circuit of claim 18, wherein said differentiating means includes two low pass filters, each low pass filter operable to delay said input data stream signal by ¼ bit time.

20. The circuit of claim 17, wherein said differentiating means includes an EXCLUSIVE OR logic gate and means for delaying said input data stream signal by ½ bit time for producing a delayed input data stream signal, said EXCLUSIVE OR logic gate having a first input for receiving said input data stream signal and a second input for receiving said delayed input data stream signal, said input data differential signal being provided on the output of said EXCLUSIVE OR logic gate.

21. The circuit of claim 20, wherein said delaying means includes a plurality of low-pass filters connected in series, each low pass filter of said delaying means having a control input connected with said oscillator control voltage.

22. The circuit of claim 21, wherein said delaying means includes two low-pass filters, each low-pass filter of said delaying means operable to delay said input data stream signal by ¼ bit time.

23. The circuit of claim 17, wherein said voltage controlled oscillator includes a low pass filter and an integrator, said low pass filter of said voltage controlled oscillator including a cut-off frequency control input for receiving said oscillator control voltage, said oscillator control voltage controlling the oscillating frequency of said voltage controlled oscillator.

24. The circuit of claim 23, wherein said integrator includes an operational transconductance amplifier and a plurality of capacitors.

25. The circuit of claim 17, wherein said voltage controlled oscillator includes:
- a low pass filter having a cut-off frequency control input for receiving said oscillator control voltage, a positive input terminal, a negative input terminal, a positive output terminal, and a negative output terminal;
- an operational transconductance amplifier having a positive input terminal connected with the positive output terminal of said low pass filter, a negative input terminal connected with the negative output terminal of said low pass filter, a positive output terminal connected with the negative input terminal of said low pass filter, and a negative output terminal connected with the positive input terminal of said low pass filter;
- a first capacitor connected between the positive output terminal of said operational transconductance amplifier and a reference voltage; and
- a second capacitor connected between the negative output terminal of said operational transconductance amplifier and said reference voltage.

* * * * *